(12) United States Patent
Gomez et al.

(10) Patent No.: US 7,421,259 B2
(45) Date of Patent: Sep. 2, 2008

(54) RF MIXER WITH HIGH LOCAL OSCILLATOR LINEARITY USING MULTIPLE LOCAL OSCILLATOR PHASES

(75) Inventors: Ramon A. Gomez, San Juan Capistrano, CA (US); Takayuki Hayashi, Lake Forest, CA (US)

(73) Assignee: Broadcom Corporation, Irvine, CA (US)

( * ) Notice: Subject to any disclaimer, the term of this patent is extended or adjusted under 35 U.S.C. 154(b) by 339 days.

(21) Appl. No.: 10/825,655

(22) Filed: Apr. 16, 2004

(65) Prior Publication Data
US 2005/0233723 A1 Oct. 20, 2005

(51) Int. Cl.
H04B 1/26 (2006.01)
H04B 15/00 (2006.01)
(52) U.S. Cl. .................. 455/130; 455/315; 455/323
(58) Field of Classification Search ......... 455/313–318, 455/323–326, 302, 305
See application file for complete search history.

(56) References Cited

U.S. PATENT DOCUMENTS

| | | | | |
|---|---|---|---|---|
| 5,708,399 | A * | 1/1998 | Fujii et al. | 332/103 |
| 6,140,849 | A * | 10/2000 | Trask | 327/113 |
| 6,628,343 | B1 | 9/2003 | Yamaguchi et al. | 348/731 |
| 6,782,247 | B2 * | 8/2004 | Nilson et al. | 455/313 |
| 6,947,513 | B2 * | 9/2005 | O'Toole et al. | 375/374 |
| 7,027,792 | B1 * | 4/2006 | Luff et al. | 455/314 |
| 7,088,981 | B2 * | 8/2006 | Chang | 455/326 |
| 7,130,604 | B1 * | 10/2006 | Wong et al. | 455/302 |
| 2001/0041548 | A1 * | 11/2001 | Bult et al. | 455/252.1 |
| 2002/0004376 | A1 * | 1/2002 | Lee et al. | 455/326 |
| 2002/0193089 | A1 * | 12/2002 | Hatcher et al. | 455/326 |
| 2003/0007377 | A1 * | 1/2003 | Otaka | 363/127 |
| 2003/0119474 | A1 * | 6/2003 | Kimura | 455/333 |
| 2003/0176177 | A1 * | 9/2003 | Molnar et al. | 455/323 |
| 2004/0166799 | A1 * | 8/2004 | Kral | 455/3.02 |
| 2004/0214547 | A1 * | 10/2004 | Kim et al. | 455/296 |
| 2005/0024544 | A1 * | 2/2005 | Waight et al. | 348/731 |
| 2005/0186930 | A1 * | 8/2005 | Rofougaran et al. | 455/260 |
| 2005/0206416 | A1 * | 9/2005 | Kizer | 327/156 |
| 2005/0239430 | A1 * | 10/2005 | Shah | 455/326 |

(Continued)

OTHER PUBLICATIONS

Jeffrey A. Weldon et al., "A 1.75-GHz Highly Integrated Narrow-Band CMOS Transmitter with Harmonic-Rejection Mixers," IEEE Journal of Solid State Circuits, vol. 36, No. 12, Dec. 2001, pp. 2003-2015.

*Primary Examiner*—Simon Nguyen
(74) *Attorney, Agent, or Firm*—Sterne, Kessler, Goldstein & Fox, P.L.L.C.

(57) ABSTRACT

An RF mixer includes a plurality of submixers coupled to a single input transistor pair and a single tail current source. An input LO signal is divided into multiple individual waveforms, each having a different phase. The phase differences are even in that the phase difference between any two time-adjacent individual waveforms is approximately equal to the phase difference between any other two time-adjacent individual waveforms. The submixers are appropriately scaled so that the individual waveforms, when summed, create a piecewise linear LO signal. The submixers also combine the individual waveforms with an input baseband signal to produce an output signal or to produce a baseband signal from an input mixed signal. In order to reduce noise in the system, only one submixer is active at any time. Further, polarities of some individual waveforms are reversed so that to avoid signal cancellation when by combining waveforms of opposite polarities.

22 Claims, 9 Drawing Sheets

U.S. PATENT DOCUMENTS

2006/0003727 A1* 1/2006 Litwin et al. ................. 455/323
2006/0148440 A1* 7/2006 Bargroff ..................... 455/323
2006/0154625 A1* 7/2006 Malone et al. .............. 455/118

* cited by examiner

RF MIXER WITH HIGH LOCAL OSCILLATOR LINEARITY USING MULTIPLE LOCAL OSCILLATOR PHASES

BACKGROUND OF THE INVENTION

1. Field of the Invention

This invention is related to the field of radio frequency (RF) signal processing, specifically RF mixers.

2. Related Art

Conventional switching mixers used in RF transceivers generate harmonics of a local oscillator ("LO") frequency. Two main contributors of these harmonics are the shape of the LO waveform and the switching action of the mixer. The LO waveform shape usually resembles a square wave more than a sinusoidal wave, especially at low LO frequencies. A square wave, unlike a single-tone sinusoidal wave, contains harmonics at odd multiples of the main frequency. These harmonics appear at the mixer output when a square wave is used as a LO signal. Further, even if a sinusoidal LO signal were employed, harmonics would still exist because of the inherent switching action of LO transistor pairs in the mixer.

In a typical transmitter where up-conversion is required, these harmonics create copies of a baseband signal at odd multiples of the LO frequency. To attenuate these unwanted harmonics, a post-filtering is required. This post-filtering adds noise, power, and complexity to the system.

Mixers used in receiver applications are also affected by LO harmonics. For example, in a direct down-conversion receiver, RF input signals at odd multiples of the LO frequency land directly on top of each other at the mixer output. In this case, a pre-filtering is required to attenuate the signals near the frequency of the odd LO harmonics at the input, prior to the mixer stage.

Therefore, what is needed is a mixer that does not produce strong mixing products with harmonics of the LO signal, yet reduces noise and decreases sensitivity to rise and fall times of an input signal.

SUMMARY OF THE INVENTION

In the present invention, circuit noise is reduced by using a mixer created from at least six submixers. These submixers share a common input transistor and tail current source. The LO signal is divided into a plurality of individual LO waveforms. These individual LO waveforms are scaled in such a manner that, when combined, they approximate a piecewise linear LO signal. The phase differences between the submixers are evenly spaced. That is, the phase difference between any two time-adjacent individual LO waveforms is the same as the phase difference between any other two time-adjacent individual LO waveforms, including the first and last waveforms. None of the individual LO waveforms overlaps another individual LO waveform. This makes the mixer less sensitive to rise and fall time of LO signals.

The scaling of the waveforms takes place within the submixers. To approximate the piecewise linear LO signal, some submixers are scaled to have a gain of zero. Others are scaled to have a gain of one. Still other submixers are scaled to an intermediate level, such as sqrt(2)/2 (herein, the mathematical function "square root" will be denoted as "sqrt"). Certain individual LO waveforms have polarities opposite that of other individual LO waveforms. For the waveforms with opposite polarities, their corresponding submixers reverse the polarity of the individual waveforms. Because of this, none of the individual LO waveforms are cancelled out due to interaction with other individual LO waveforms.

The submixers are employed in such a way that only one of the submixers is active at any time. This further ensures that there is no signal cancellation of two or more submixer outputs that would result in adding noise to the system.

A signal is input into the submixers. This signal may be, for example, a baseband signal or an intermediate frequency (IF) signal. A switch on each of the submixers is driven with the individual LO waveforms such that only one of the submixers is active at a given time. The switch may include at least one electrical gate corresponding to each submixer. In one embodiment, when the signal to the gate is high, the submixer is active. Likewise, when the signal to the gate is low, the submixer is inactive.

The input signal is mixed with the individual LO waveforms using the active submixers. The outputs of the submixers are then summed to generate a final output signal.

Further embodiments, features, and advantages of the present invention, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

The present invention will be described with reference to the accompanying drawings. The drawing in which an element first appears is typically indicated by the leftmost digit(s) in the corresponding reference number.

DETAILED DESCRIPTION OF THE INVENTION

While specific configurations and arrangements are discussed, it should be understood that this is done for illustrative purposes only. A person skilled in the pertinent art will recognize that other configurations and arrangements can be used without departing from the spirit and scope of the present invention. It will be apparent to a person skilled in the pertinent art that this invention can also be employed in a variety of other applications.

Figure 1:
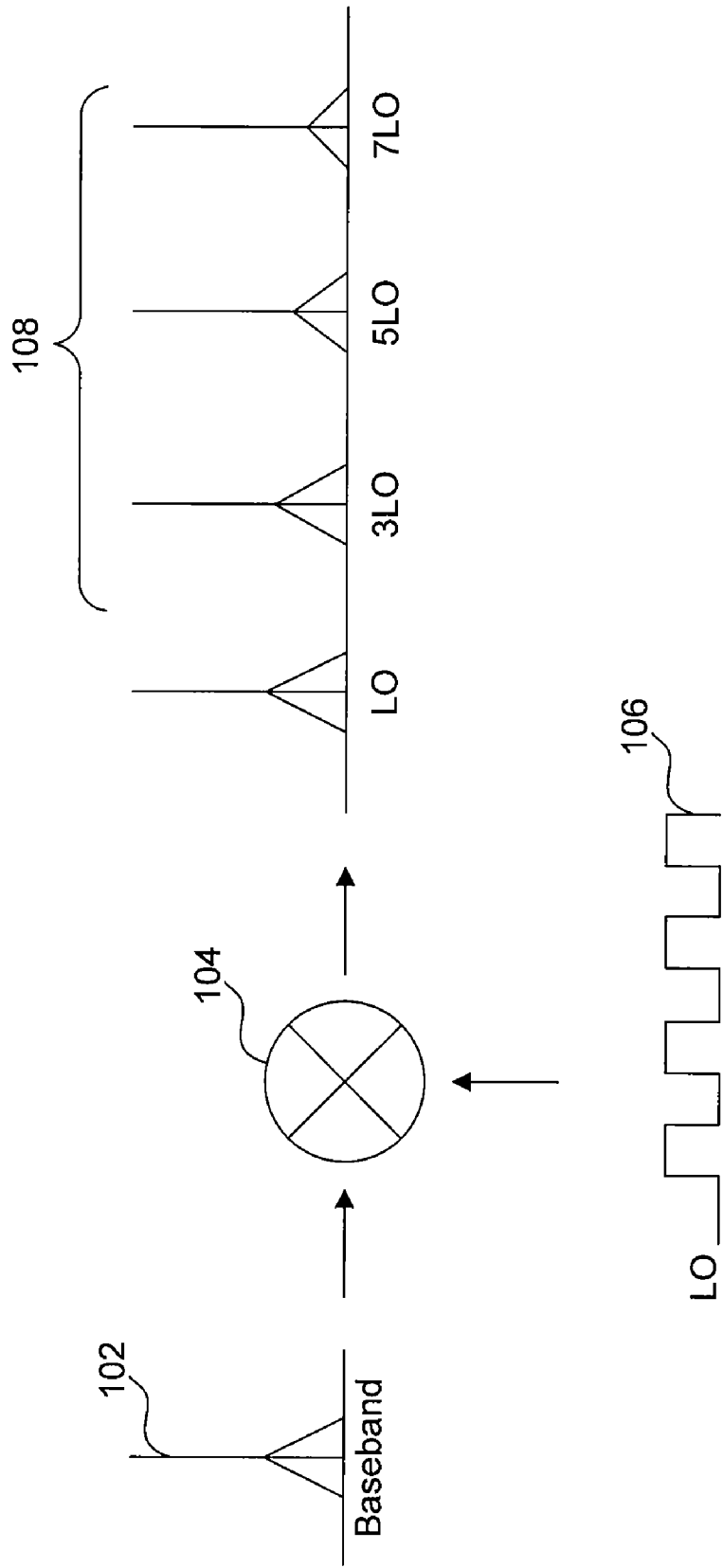
FIG. 1 is an illustration of harmonics created in a transmitter where up-conversion is required.

FIG. 1 is an illustration of harmonics created in a transmitter requiring up-conversion. A baseband signal 102 enters a mixer 104, where it is combined with a local oscillator ("LO") signal 106. Because LO signal 106 is a square wave, harmonics 108 of baseband signal 102 are created at odd multiples of the LO frequency. Although harmonics 108 lessen in amplitude at higher orders, they are of sufficient amplitude to add unwanted noise to the output. In such a system, a filter must be used to attenuate the higher order harmonics after they are produced by mixer 104.

Figure 2:
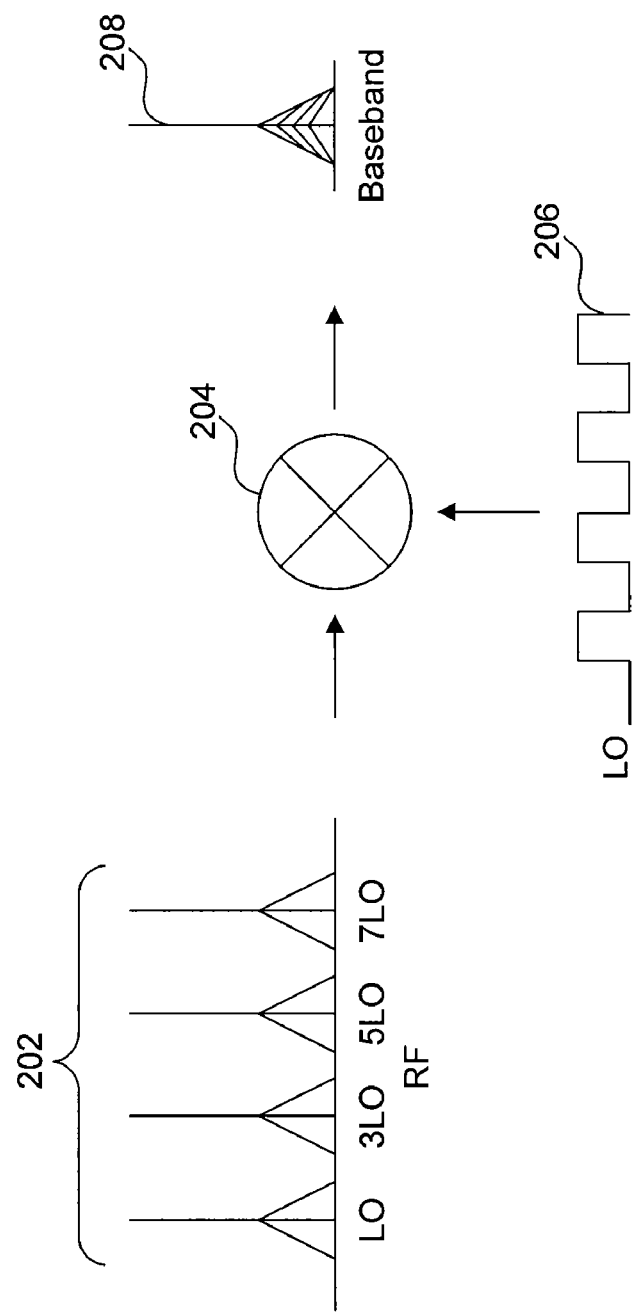
FIG. 2 is an illustration of harmonics created in a transmitter where down-conversion is required.

FIG. 2 illustrates a similar situation which occurs in a down-conversion receiver. In this case, RF input signals 202 at odd multiples of the LO frequency enter a mixer 204, where they are combined with LO signal 206. With down-conversion, RF input signals 202 land directly on top of each other at mixer output 208. To avoid this problem, RF input signals 202 must be filtered prior to entering mixer 204.

Figure 3A:
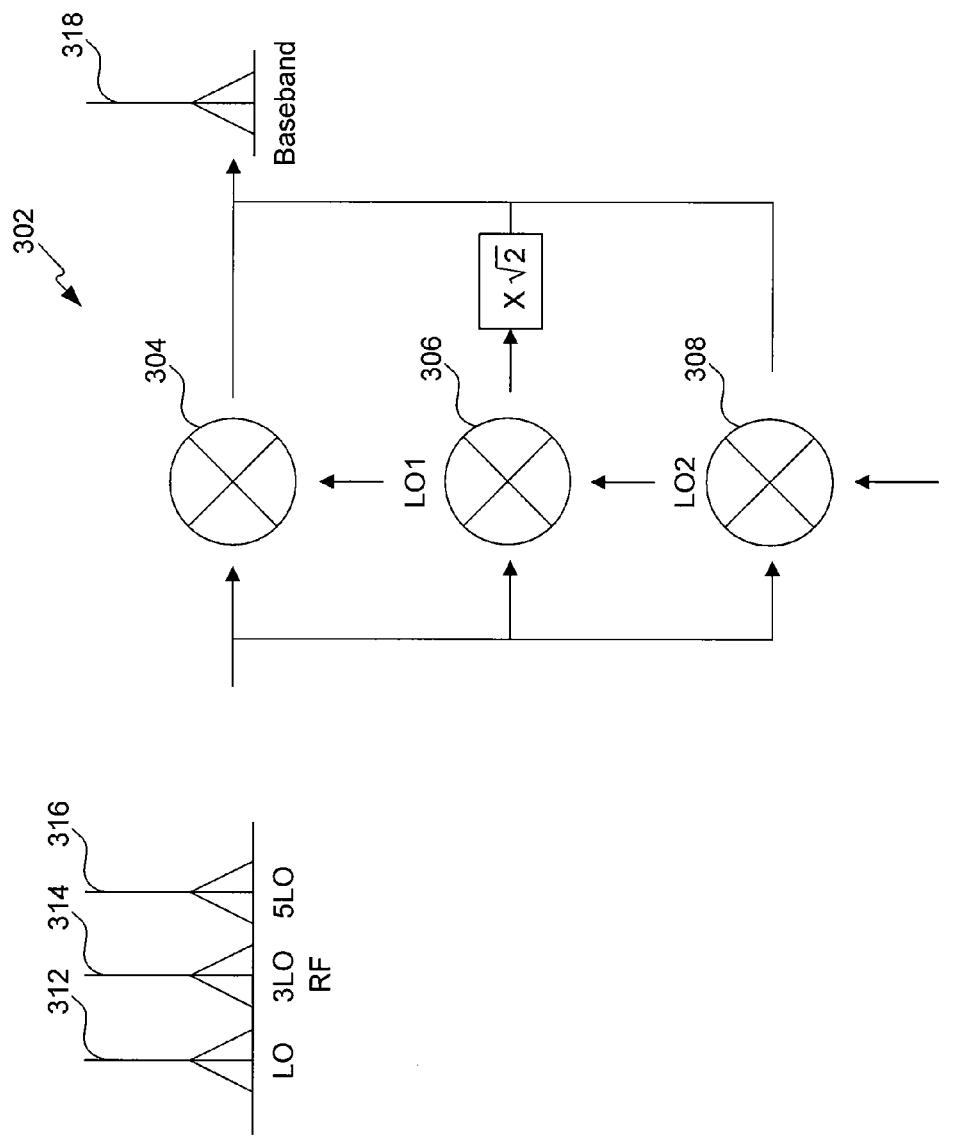
FIG. 3A is an illustration of a three-element harmonic-rejection mixer.
Figure 3B:
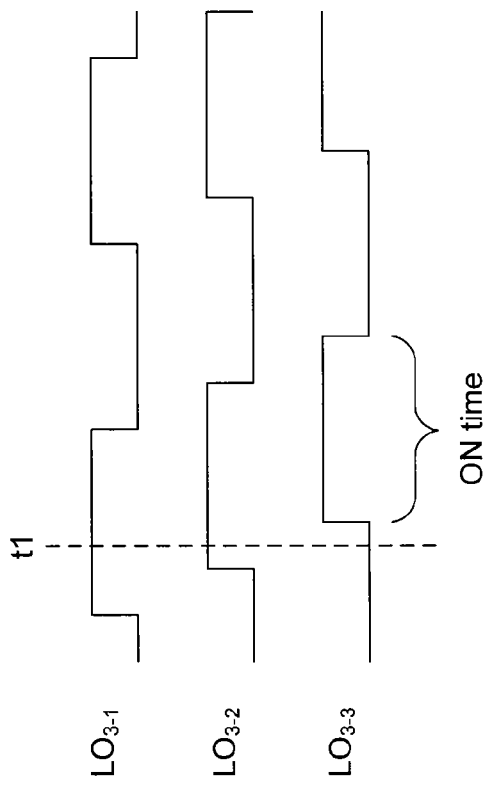
FIG. 3B is an illustration of phase-shifted LO signals.
Figure 3C:
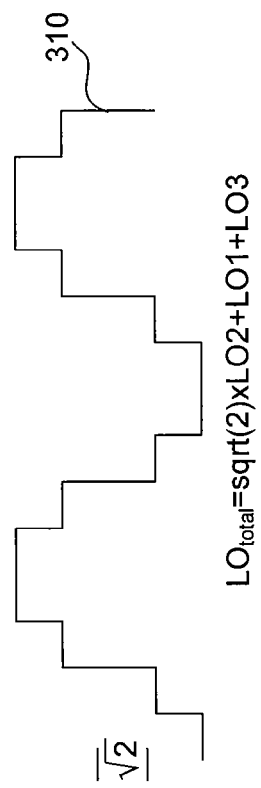
FIG. 3C is an illustration of a signal created by combining the signals of FIG. 3B.

One alternative to using filters to attenuate the third and fifth harmonics is discussed in a paper by Jeffrey A. Weldon et al., "A 1.75-GHz Highly Integrated Narrow-Band CMOS Transmitter With Harmonic-Rejection Mixers," *IEEE Journal of Solid State Circuits*, Vol. 36, No. 12, December 2001, pp. 2003-2015, which is incorporated by reference herein in its entirety. As shown in FIG. 3A, their approach is to create a combined mixer 302 made up of three individual mixers 304, 306, and 308. Although each of mixers 304, 306, and 308 are individual mixers that can stand alone as well as be combined with other mixers, they will be referred to herein as submixers 304, 306, and 308, so as to distinguish them from combined mixer 302. Submixers 304, 306, and 308 are driven with multiple phase-shifted LO waveforms. An illustration of phase-shifted LO waveforms is shown in FIG. 3B. Phase-shifted waveforms $LO_{3-1}$-$LO_{3-3}$ are mixed into the outputs of submixers 304-308, respectively. When a waveform is high, the corresponding submixer becomes active and produces an output. For example, waveform $LO_{3-1}$ is mixed into the output of submixer 304. Waveform $LO_{3-2}$ is mixed into the output of submixer 306, and is phase-shifted from waveform $LO_1$ by 45°. Waveform $LO_{3-3}$ is mixed into the output of submixer 308, and is phase-shifted from waveform $LO_2$ by 45° and from waveform $LO_1$ by 90°. When the phase-shifted LO waveforms are combined, they create a piecewise linear LO waveform 310 ($LO_{total}$), as shown in FIG. 3C. To accurately represent a piecewise waveform, the magnitude of signal $LO_{3-2}$ is scaled by sqrt(2). Specifically, $LO_{total}$=[sqrt(2)]$LO_{3-2}$+$LO_{3-1}$+$LO_{3-3}$.

In FIG. 3A, a LO signal 312, along with a third harmonic 314 and a fifth harmonic 316, is combined with piecewise LO waveform 310 in mixer 302. The outputs of submixers 304, 306, and 308 are combined to create baseband signal 318. Due to the opposite phases of the output of submixer 304 (phase-shifted by 0°) and the output of submixer 306 (phase-shifted by 90°), the third harmonic 314 and the fifth harmonic 316 are effectively cancelled.

Ideally, this cancellation would be perfect. In practical applications, though, the amount of harmonic cancellation is not perfect and strongly depends on the phase error and gain error of the mixer in use. The phase error is considered to be any deviation in phase difference from the ideal case of 45° between two time-adjacent submixer outputs. The gain error, on the other hand, is any deviation in gain from the ideal value of one for submixers 304 and 308, and sqrt(2) for submixer 306. For example, a phase error of 1 degree and a gain error of 1% result in third and fifth harmonic rejection of, for example, 35 dB instead of infinite if there were absolutely no phase or gain error.

Figure 4:
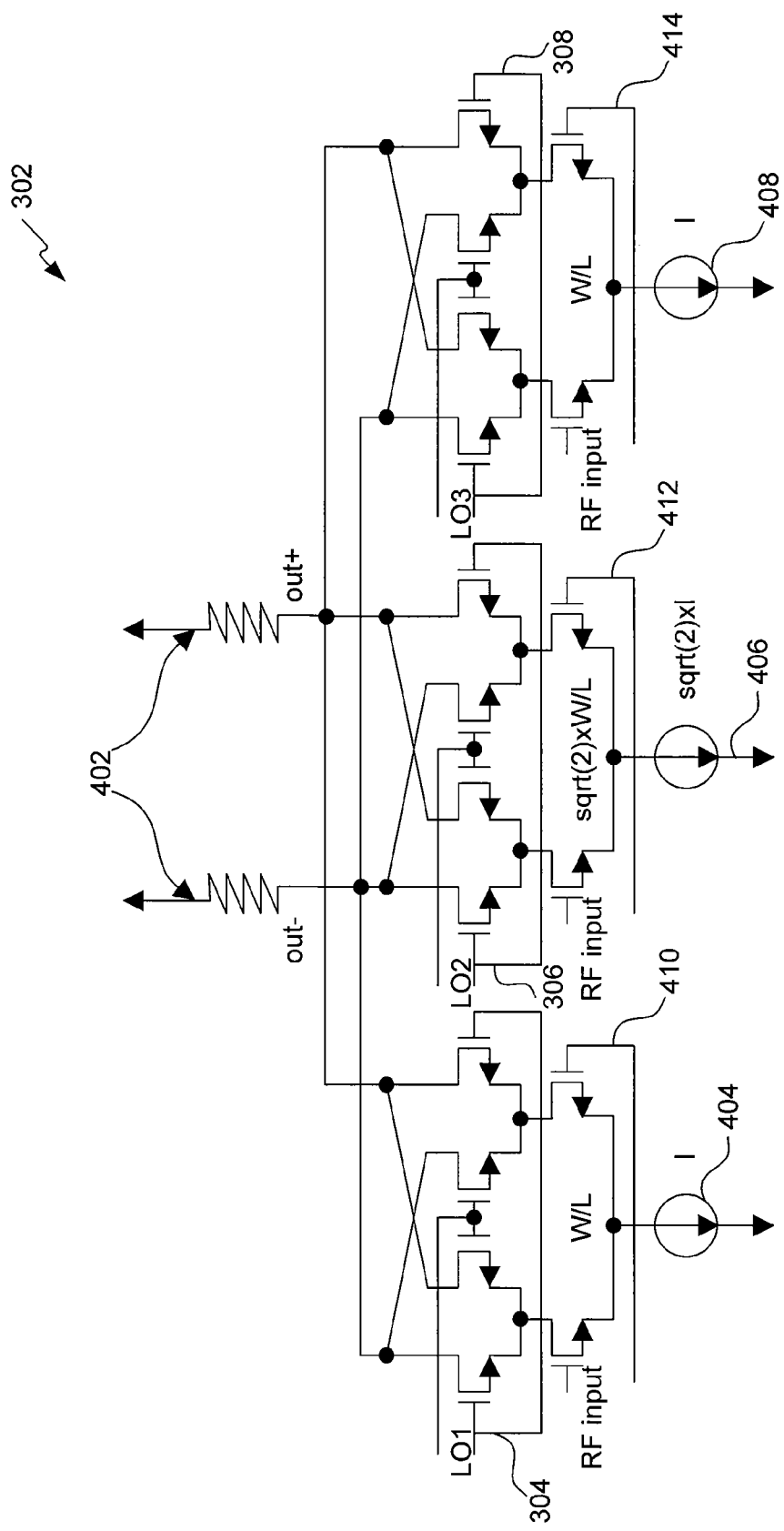
FIG. 4 is a diagram of a three-element harmonic-rejection mixer.

FIG. 4 shows a simplified schematic diagram of three-part mixer 302. The three identical submixers 304, 306, and 308 are connected in parallel, and share a common resistive load 402. Each of submixers 304, 306, and 308 has its own tail current source 404, 406, and 408, respectively. Each of submixers 304, 306, and 308 also has its own RF input transistor 410, 412, and 414, respectively. The gain factor of sqrt(2) for the submixer 306 is realized by scaling its tail current source 406 and the size of its RF input transistor 412 by sqrt(2).

This approach may seem similar to driving a single submixer with a LO waveform shaped like piecewise waveform 310 in FIG. 3. However, harmonics are also generated by the switching transistor pairs in mixer 302. Thus, there is no advantage to be gained by summing multiple LO signals with a single submixer. Any harmonic cancellation must come after the switching transistor pairs (i.e., at the output of the mixer), which is achieved by summing multiple outputs.

Noise performance, however, suffers in the system of FIGS. 3A and 4 because two submixers with opposite LO polarity may produce mixed output at the same time. For example, during time t1 in FIG. 3B, submixers 304 and 308 have opposite polarity and therefore their outputs, $LO_1$ and $LO_3$, effectively cancel. Combining these outputs with $LO_2$ only adds noise to the system.

In addition, the phase difference between $LO_1$ and $LO_2$, as well as between $LO_2$ and $LO_3$, is 45°. However, the phase difference between $LO_3$ and $LO_1$ is 90°. This uneven phase spacing causes harmonic rejection to be sensitive to the rise and fall time of the LO signals. Any increase in rise and fall time would have more impact on the $LO_1$-$LO_2$ and on the $LO_2$-$LO_3$ mixer interfaces than it would on the $LO_3$-$LO_1$ mixer interface.

Figure 5A:
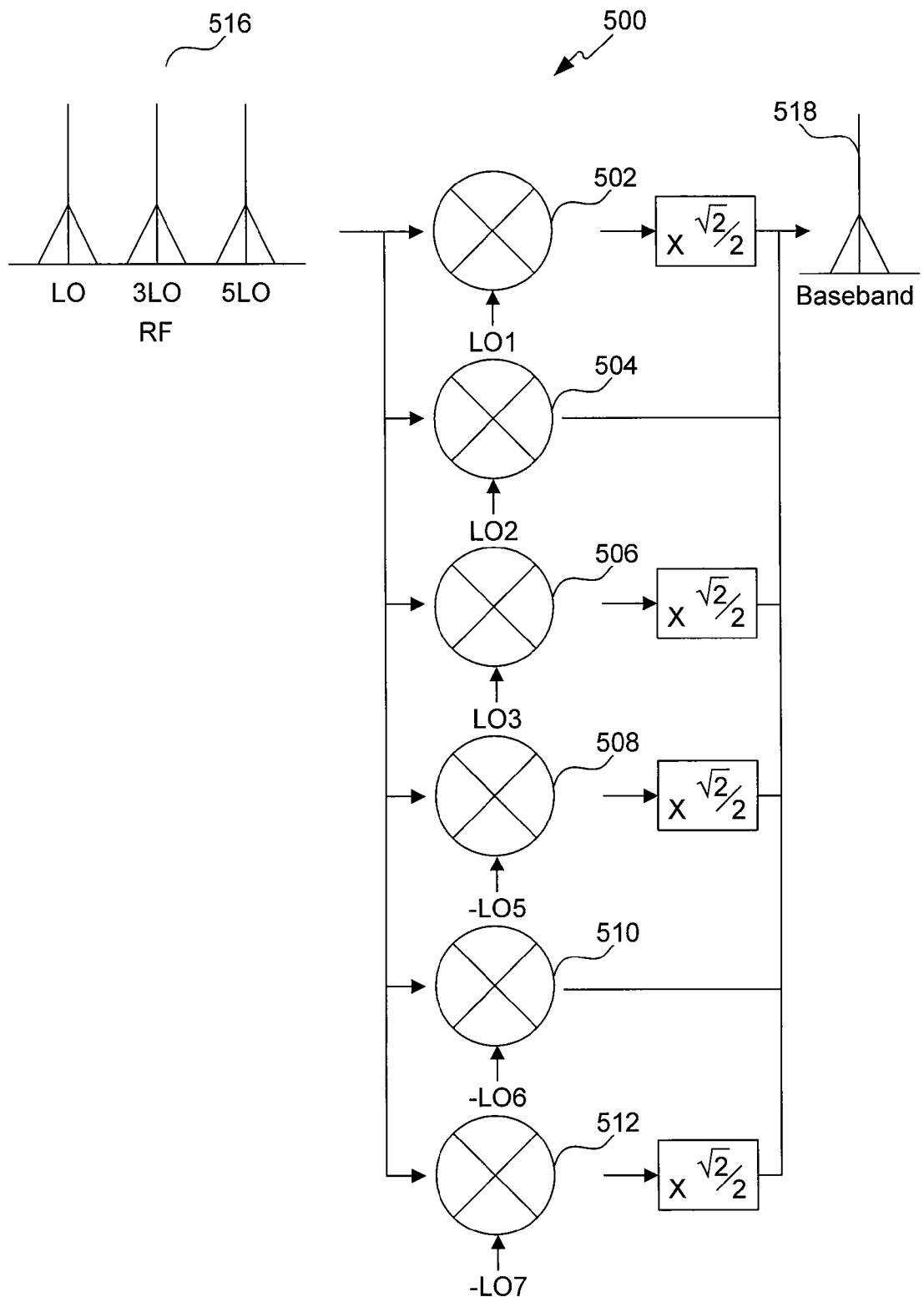
FIG. 5A is an illustration of a six-element harmonic-rejection mixer according to an embodiment of the present invention.
Figure 5B:
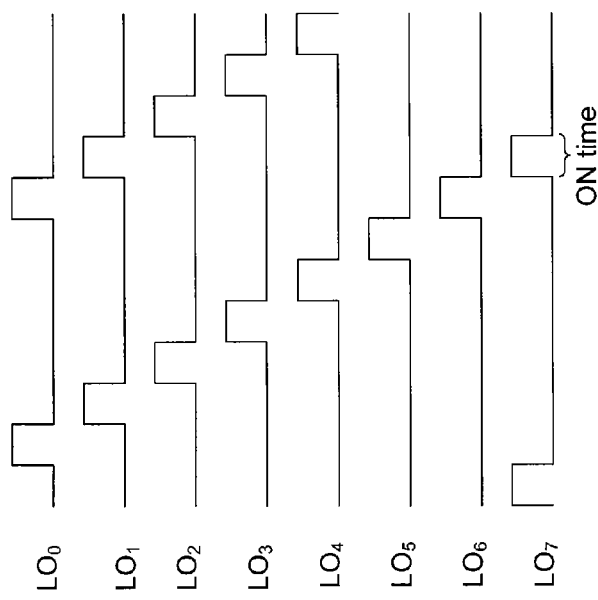
FIG. 5B is an illustration of phase-shifted LO signals according to an embodiment of the present invention.

An illustration of a mixer 500 according to an embodiment of the present invention is shown in FIG. 5A. Mixer 500 includes six submixers 502, 504, 506, 508, 510, and 512. Submixers 502, 504, 506, 508, 510, and 512 are connected in parallel. Although the present embodiment utilizes six submixers, one of skill in the art will recognize that harmonic rejection can also be achieved by employing more submixers and more LO signals with different phases. An input LO signal is divided into eight individual LO waveforms $LO_0$-$LO_7$. As shown in FIG. 5B, the length of time that the amplitude is high ("ON time") for each of the individual LO waveforms $LO_0$-$LO_7$ is much shorter than the ON time of the waveforms in FIG. 3B. This shortened ON time prevents the LO waveforms from overlapping when they are combined. Non-overlapping LO waveforms ensure that only one submixer is active at any one time, since the submixers only become active when a corresponding waveform is high. This is important in terms of noise performance, because two or more submixers active with opposite LO polarity (as with submixers 304 and 308 described above) cancel out their signals and only add noise to the system.

Figure 5C:
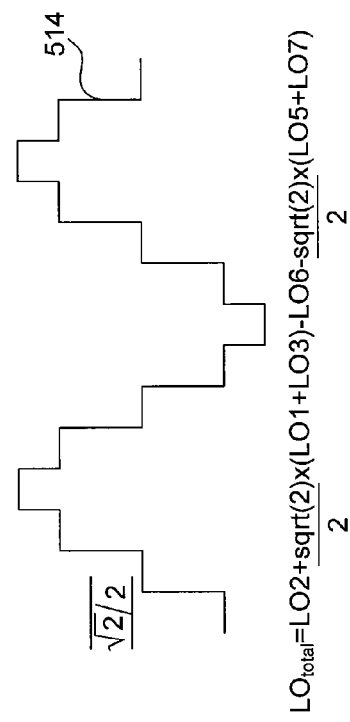
FIG. 5C is an illustration of a piecewise linear LO function according to an embodiment of the present invention.

Each individual waveform $LO_0$-$LO_7$ has its own phase. In the present invention, the phase difference between any two time-adjacent LO waveforms is approximately equal to the phase difference between any other two time-adjacent LO waveforms. The phase difference between $LO_7$ and $LO_0$ is also approximately equal to the phase difference between other time-adjacent LO waveforms. For example, in an embodiment of the present invention, the phase difference between any two time-adjacent LO waveforms is approximately 45°. By keeping all LO waveforms evenly spaced out, any impact from degradation in rise and/or fall time of LO waveforms is minimized. Piecewise linear LO waveform 514, shown in FIG. 5C, is created from the sum of $LO_0$-$LO_7$. To accurately represent a piecewise waveform, the magnitudes of signals $LO_1$, $LO_3$, $LO_5$ and $LO_7$ are scaled by sqrt(2)/2. Further, the magnitudes of signals $LO_0$ and $LO_4$ are scaled to zero. The resulting piecewise waveform 514 ($LO_{total}$) is characterized by the following equation:

$$LO_{total}=LO_2+[sqrt(2)/2](LO_1+LO_3)-LO_6-[sqrt(2)/2](LO_5+LO_7).$$

To effect the magnitude scalings and achieve complete harmonic cancellation, the outputs of submixers 502, 506, 508, and 512 are scaled by sqrt(2)/2. Since signals $LO_0$ and $LO_4$ are scaled to zero, there is no need for respective submixers for these signals. In addition, the polarity of submixers 508, 510, and 512 are reversed so that their baseband outputs do not act to cancel out other baseband outputs.

Although FIG. 5A is shown as receiving an intermediate frequency (IF) signal 516 (with harmonics) and outputting a clean baseband signal 518, one of skill in the art will recognize that a similar system may be used to receive a baseband signal and output a clean mixed signal while keeping with the spirit and scope of the present invention.

Figure 6:
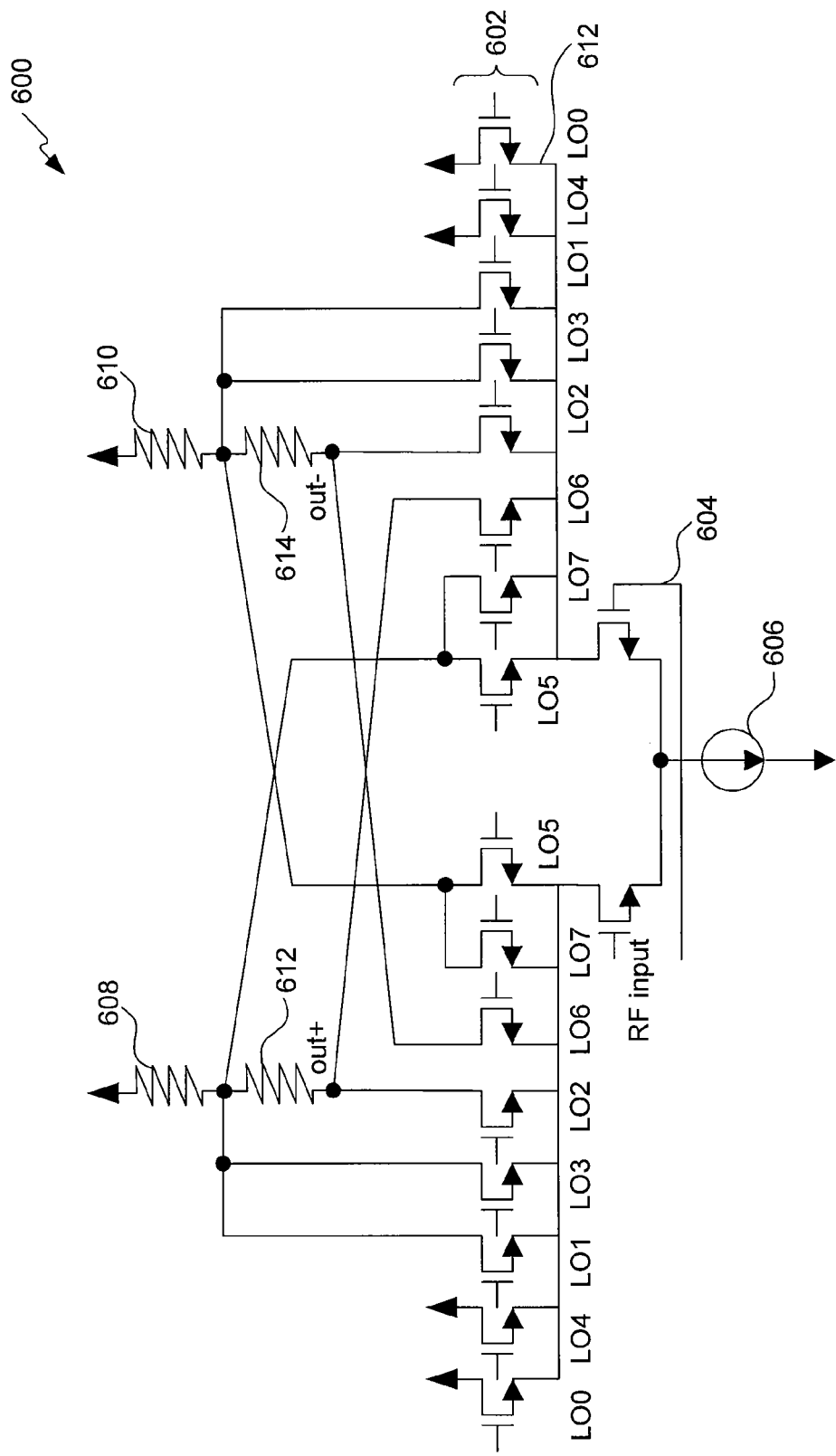
FIG. 6 is a diagram of a six-element harmonic-rejection mixer with a common input transistor and tail current source according to an embodiment of the present invention.

FIG. 6 shows a schematic diagram of a mixer 600 according to an embodiment of the present invention. The submixers 602 share a common RF input transistor pair 604 (also called transconductance stage 604) and tail current source 606 to save power consumption. A set of switches 612 determine which of submixers 602 is active. In an embodiment, set of switches 612 includes at least one gate corresponding to each submixer, wherein the gates respond to electrical signals. When a gate receives a high signal, such as from one of the LO waveforms, it closes to activate its corresponding submixer. Similarly, when a gate receives a low signal, its corresponding submixer is inactive and the gate is open. Thus, current will only flow through the active submixer.

The determination of which submixer should be active is made based on the phase of the incoming LO signal. For example, in the embodiment of FIG. 5A, the phase of waveform $LO_1$ corresponds to submixer 502. When wavevform $LO_4$ is high, submixer 502 is active. At the same time, since no other waveforms are high, all other submixers are inactive. When signals $LO_0$ and $LO_4$ are high, mixer 600 is in an off state. During this time, four outer transistors (two on each side) are used to keep tail current source 606 in operation.

A gain factor of sqrt(2)/2, discussed above, is achieved by using two scaled resistive loads 608 and 610. Resistive load 608 is coupled to resistive load 612, and resistive load 610 is coupled to resistive load 614. Resistive loads 608 and 610 each have a resistance $R_1$. Resistive loads 612 and 614 each have a resistance $R_2$. In order to allow gains of both 1 and sqrt(2)/2, $R_1 \approx [sqrt(2)/2](R_1+R_2)$. When a gain of 1 is desired, all four resistive loads 608-614 are used. When a gain of sqrt(2)/2 is desired, only resistive loads 608 and 610 are used. For example, in an embodiment $R_1=61.3\Omega$, and $R_2=26.3\Omega$. Since $(R_1+R_2)=87.6\Omega$, $R_1$ is approximately equal to $[sqrt(2)/2](R_1+R_2)$.

One of skill in the art will recognize that alternative resistances may be used as required for different applications. Further, one of skill in the art will recognize that, if the number of submixers is increased and the phase between two time-adjacent LO waveforms is different from 45°, a gain factor other than [sqrt(2)]/2 may be required. In this case, one of skill in the art will recognize that the resistances of loads 608, 610, 612, and 614 will change accordingly.

Mixer 600 has high-quality noise performance compared to, for example, mixer 302, because only one submixer is active at any one time. There is no signal cancellation of two or more submixer outputs due to the LO polarity being reversed. The LO waveforms $LO_0$-$LO_7$ used in mixer 600 are evenly spaced in terms of phase. This makes mixer 600 less sensitive to degradation in rise and fall time of LO signals. Further, power is conserved since submixers 602 share tail current source 606.

With this architecture, higher-order harmonics (seventh and above) still remain untouched, but their frequencies are sufficiently high that they can be either ignored or easily removed using techniques known to those of skill in the art, such as implementing a low pass filter. If more harmonics must be suppressed, additional LO phases may be used.

Figure 7:
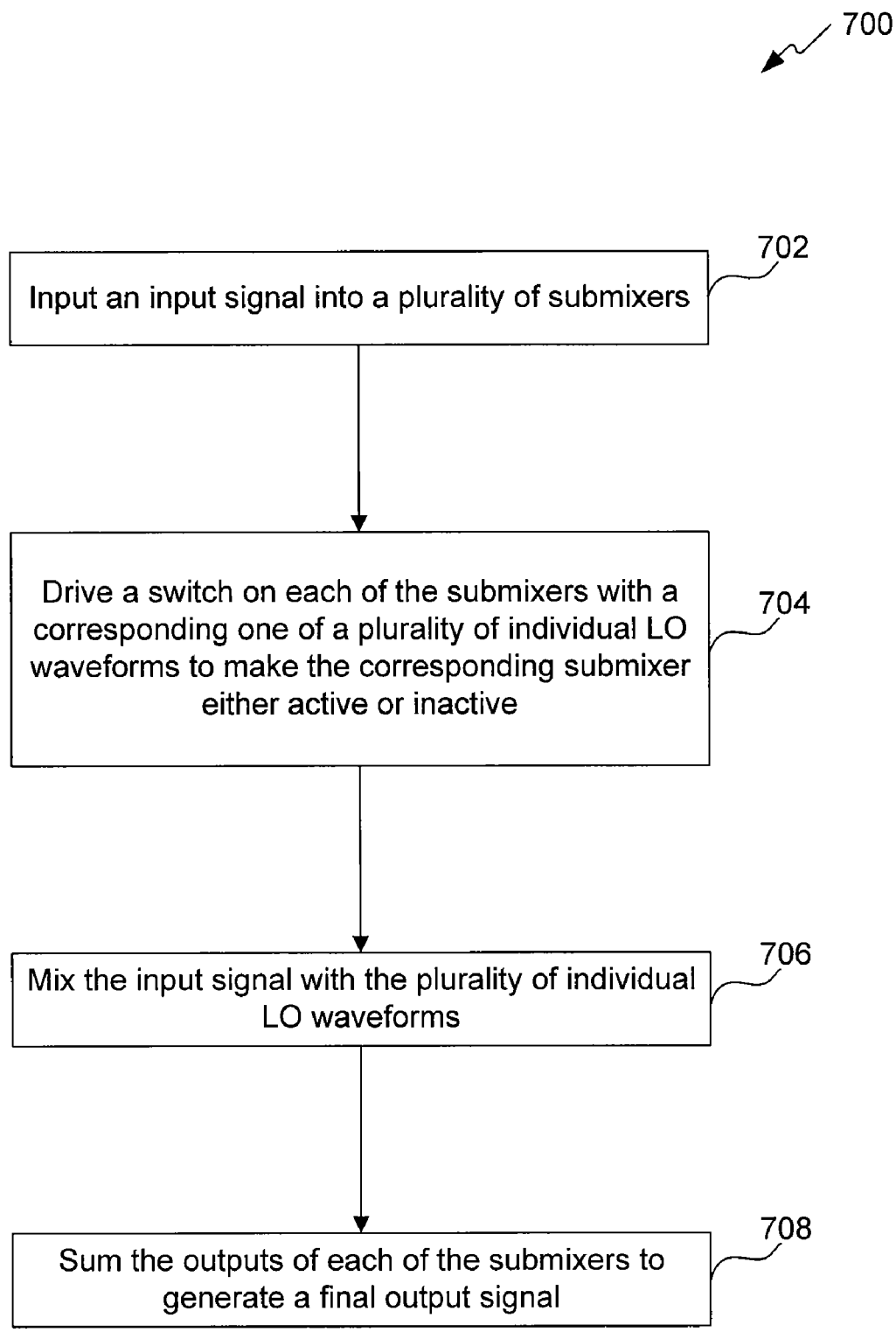
FIG. 7 is a flowchart of a method according to an embodiment of the present invention.

FIG. 7 is a flowchart of a method 700 according to an embodiment of the present invention. Method 700 may be implemented with, for example, mixer 600. In step 702, an input signal, such as IF signal 516, is input into a plurality of submixers, such as submixers 602.

In step 704, a switch on each of the plurality of submixers is driven with a corresponding one of a plurality of individual LO waveforms to make the submixer corresponding to the switch either active or inactive. If the phase of an individual LO waveform input into the mixer corresponds to a particular submixer, that submixer will become active. For example, if individual LO waveform $LO_1$ is high, it will activate a switch corresponding to submixer 502. The switches are driven such that only one of the plurality of submixers is active at any given time.

In step 706, the input signal is mixed with the plurality of individual LO waveforms.

In step 708, outputs of each of the plurality of submixers are summed to generate a final output signal, such as baseband signal 518. Because only one submixer was active at a given time, and because no signals were output that had opposite polarities as other signals, noise is reduced in the final output signal compared to conventional mixers.

Although method 700 was described herein with reference to an input IF signal, one of skill in the art will recognize that method 700 may also be used with an input baseband signal to output a mixed signal.

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A radio frequency (RF) mixer, comprising:
   a. an input transistor pair, configured to receive a baseband signal and a local oscillator (LO) signal;
   b. a plurality of submixers coupled to each other in parallel, configured to mix the baseband signal and individual phase-shifted LO waveforms, each submixer in the plurality of submixers being driven by a single phase-shifted LO waveform and having a polarity that prevents cancellation of signals output from each other submixer in the plurality of submixers; and
   c. a tail current source configured to supply power,
   wherein the plurality of submixers share the input transistor pair and the tail current source, and
   wherein the LO signal is divided into a plurality of individual phase-shifted LO waveforms that create a piecewise linear waveform approximating the LO signal when combined, and a phase difference between any two time-adjacent individual LO waveforms in the plurality of individual LO waveforms is approximately equal to a phase difference between any other two time-adjacent individual LO waveforms in the plurality of individual LO waveforms.

2. The RF mixer of claim 1, wherein said phase difference is approximately 45 degrees.

3. The RF mixer of claim 1, wherein an ON time of an individual LO waveform in the plurality of individual LO waveforms does not overlap with an ON time of another individual LO waveform in the plurality of individual LO waveforms.

4. The RF mixer of claim 1, wherein said plurality of submixers includes six submixers.

5. The RF mixer of claim 4, wherein first, third, fourth, and sixth submixers output a signal that is scaled by sqrt(2)/2.

6. The RF mixer of claim 4, wherein said LO signal comprises eight square waves summed into a piecewise linear signal.

7. The RF mixer of claim 1, wherein only one submixer in the plurality of submixers is active at a time.

8. The RF mixer of claim 1, wherein the LO signal is divided into a plurality of individual LO waveforms, each individual LO waveform driving a single submixer, wherein each submixer shares the baseband signal and produces an output signal that is a scaled version of the baseband signal, and wherein the sum of the output signals is a piecewise linear waveform.

9. A method of RF mixing, comprising:
 a. inputting an input signal to a plurality of submixers, each submixer in the plurality of submixers having a polarity that prevents cancellation of signals output from each other submixer in the plurality of submixers;
 b. driving a switch on each of the plurality of submixers with a corresponding one of a plurality of individual LO waveforms such that only one of the plurality of submixers is active at a time, wherein the plurality of individual LO waveforms create a piecewise linear waveform approximating a sinusoidal LO signal when combined and wherein a phase difference between any two time-adjacent waveforms in the plurality of individual LO waveforms is approximately equal to a phase difference between any other two time-adjacent waveforms in the plurality of individual LO waveforms;
 c. mixing the input signal with the plurality of individual LO waveforms in active submixers; and
 d. summing outputs of each of the plurality of submixers to generate a final output signal.

10. The method of claim 9, wherein ON times of the plurality of individual LO waveforms do not overlap.

11. The method of claim 9, wherein said phase difference is 45°.

12. The method of claim 9, wherein said plurality of individual LO waveforms comprise eight square waves that, when summed, create a piecewise linear signal.

13. The method of claim 9, wherein said input signal is an RF baseband signal, and said output signal is an intermediate frequency signal.

14. The method of claim 9, wherein said input signal is an intermediate frequency signal, and said output signal is an RF baseband signal.

15. A mixer for extracting a baseband signal from an intermediate frequency (IF) signal, comprising:
 a. an input transistor pair, configured to receive the IF signal and a local oscillator (LO) signal;
 b. a plurality of submixers coupled to each other in parallel, configured to mix the IF signal and individual phase-shifted LO waveforms to produce the baseband signal, each submixer in the plurality of submixers being driven by a single phase-shifted LO waveform and having a polarity that prevents cancellation of a signal output from each other submixer in the plurality of submixers; and
 c. a tail current source configured to supply power,
 wherein the plurality of submixers share the input transistor pair and the tail current source, and
 wherein the LO signal is divided into a plurality of individual phase-shifted LO waveforms that create a piecewise linear waveform approximating the LO signal when combined, and a phase difference between any two time-adjacent individual LO waveforms in the plurality of individual LO waveforms is approximately equal to a phase difference between any other two time-adjacent individual LO waveforms in the plurality of individual LO waveforms.

16. The mixer of claim 15, wherein said phase difference is approximately 45 degrees.

17. The mixer of claim 15, wherein an ON time of an individual LO waveform in the plurality of individual LO waveforms does not overlap with an ON time of another individual LO waveform in the plurality of individual LO waveforms.

18. The mixer of claim 15, wherein only one submixer in the plurality of submixers is active at a time.

19. A radio frequency (RF) mixer, comprising:
 a. at least one input transistor pair configured to receive an input signal and a plurality of phase-shifted local oscillator (LO) waveforms, wherein the plurality of phase-shifted LO waveforms create a piecewise linear waveform approximating a sinusoidal LO signal when combined;
 b. a plurality of submixers coupled to each other in parallel, configured to mix the input signal and the plurality of phase-shifted LO waveforms in such a way that only one submixer is active at a time, each submixer in the plurality of submixers being driven by a single phase-shifted LO waveform and having a polarity that prevents cancellation of a signal output from each other submixer in the plurality of submixers; and
 c. at least one tail current source configured to supply power,
 wherein a phase difference between any two time-adjacent individual LO waveforms in the plurality of LO waveforms is approximately equal to a phase difference between any other two time-adjacent individual LO waveforms in the plurality of LO waveforms.

20. The RF mixer of claim 19, wherein said phase difference is approximately 45 degrees.

21. The RF mixer of claim 19, wherein an ON time of an individual LO waveform in the plurality of LO waveforms does not overlap with an ON time of another individual LO waveform in the plurality of LO waveforms.

22. The RF mixer of claim 19, wherein said plurality of submixers includes six submixers.

* * * * *